United States Patent
Grass

(10) Patent No.: US 10,923,734 B2
(45) Date of Patent: Feb. 16, 2021

(54) TEMPERATURE-CONTROL ARRANGEMENT FOR AN ELECTRICAL ENERGY STORE

(71) Applicant: Dr. Ing. h.c. F. Porsche Aktiengesellschaft, Stuttgart (DE)

(72) Inventor: Dominik Grass, Bietigheim-Bissingen (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 212 days.

(21) Appl. No.: 15/951,352

(22) Filed: Apr. 12, 2018

(65) Prior Publication Data
US 2018/0309140 A1    Oct. 25, 2018

(30) Foreign Application Priority Data
Apr. 20, 2017    (DE) .................. 10 2017 108 400

(51) Int. Cl.
*H01M 10/63*    (2014.01)
*H01M 10/66*    (2014.01)
(Continued)

(52) U.S. Cl.
CPC ............ *H01M 6/5038* (2013.01); *B60H 1/32* (2013.01); *B60K 1/00* (2013.01); *B60K 11/06* (2013.01);
(Continued)

(58) Field of Classification Search
None
See application file for complete search history.

(56) References Cited

U.S. PATENT DOCUMENTS

| 5,730,237 A | 3/1998 | Matsuki et al. |
| 9,701,188 B2 | 7/2017 | Fassnacht et al. |
| (Continued) | | |

FOREIGN PATENT DOCUMENTS

| DE | 102010014752 A1 | 11/2010 |
| DE | 102011016070 A1 | 10/2012 |
| (Continued) | | |

OTHER PUBLICATIONS

German Search Report for German Application No. 10 2017 108 400.2, dated Jan. 11, 2018 with partial English translation, 8 pages.

*Primary Examiner* — Jonathan Crepeau
(74) *Attorney, Agent, or Firm* — RatnerPrestia

(57) ABSTRACT

A temperature-control arrangement has an electrical energy store, a thermal device, a cooling device and a coolant circuit with coolant lines, which coolant lines are at least partially activatable and deactivatable by means of controllable valves. The temperature-control arrangement is designed to permit at least a first state and a second state of the coolant circuit through actuation of the controllable valves, wherein the coolant circuit is designed to, in the first state, permit a coolant flow from the cooling device both to the thermal device and to the electrical energy store, and from these back to the cooling device, in order to cool the thermal device and the electrical energy store, and wherein the coolant circuit is designed to, in the second state, permit a coolant flow from the thermal device to the electrical energy store, and from the latter back to the thermal device, in order to heat the electrical energy store.

14 Claims, 2 Drawing Sheets

(51) Int. Cl.
*H01M 10/663* (2014.01)
*H01M 10/625* (2014.01)
*H01M 10/613* (2014.01)
*H01M 10/615* (2014.01)
*H01M 10/6568* (2014.01)
*B60K 11/00* (2006.01)
*H01M 6/50* (2006.01)
*B60K 1/00* (2006.01)
*B60H 1/32* (2006.01)
*B60K 11/06* (2006.01)
*F28F 13/06* (2006.01)
*F28F 27/02* (2006.01)
*H05K 7/20* (2006.01)

(52) U.S. Cl.
CPC .............. *F28F 13/06* (2013.01); *F28F 27/02* (2013.01); *H01M 10/613* (2015.04); *H01M 10/615* (2015.04); *H01M 10/625* (2015.04); *H01M 10/63* (2015.04); *H01M 10/66* (2015.04); *H01M 10/663* (2015.04); *H05K 7/20154* (2013.01); *B60K 2001/005* (2013.01); *B60K 2001/008* (2013.01); *H01M 10/6568* (2015.04); *Y02E 60/10* (2013.01)

(56) References Cited

U.S. PATENT DOCUMENTS

2012/0225341 A1* 9/2012 Major ................ B60H 1/143
                                              429/120
2018/0154782 A1* 6/2018 Lee ................ H01M 10/625
2018/0345815 A1* 12/2018 Porras ................ B60L 58/27

FOREIGN PATENT DOCUMENTS

| DE | 102012111817 A1 | 6/2014 |
| DE | 102015106336 A1 | 10/2016 |
| EP | 2176920 A1 | 4/2010 |

* cited by examiner

TEMPERATURE-CONTROL ARRANGEMENT FOR AN ELECTRICAL ENERGY STORE

CROSS-REFERENCE TO RELATED APPLICATIONS

This application claims priority to German Patent Application No. DE 10 2017 108 400.2, filed Apr. 20, 2017, which is incorporated by reference herein in its entirety.

FIELD OF THE INVENTION

The invention relates to a temperature-control arrangement for an electrical energy store, in particular for a traction battery.

BACKGROUND OF THE INVENTION

In modern electric vehicles and hybrid vehicles which are at least temporarily driven using electrical energy, that is to say for example motor vehicles, rail vehicles or watercraft, the drive energy is commonly stored in traction batteries in the vehicle. Traction batteries are electrical energy stores which serve as an energy source for electric motors, and are also referred to as traction accumulators or drive batteries. They are preferably high-voltage batteries.

Such electrical energy stores operate well in predefined temperature ranges. In the presence of excessively high or excessively low temperatures, however, the capability of the energy store to release or receive electrical energy decreases. In the presence of extremely low or high temperatures, damage to the electrical energy store may even occur. Therefore, electrical energy stores are preferably temperature-controlled, that is to say heated in the presence of an excessively low temperature and cooled in the presence of an excessively high temperature.

DE 10 2012 111 817 A1, which is incorporated by reference herein, presents an electrical energy store with battery cells, wherein a heating device is provided between the battery cells, and wherein a cooling device for the battery cells is provided, which cooling device is thermally coupled by means of a heat exchanger to a cooling device for an internal combustion engine.

DE 10 2010 014 752 A1, which is incorporated by reference herein, presents a cooling arrangement for an energy store in a vehicle, in the case of which the energy store can be incorporated by means of a coupling element either into a first cooling circuit or into a second cooling circuit, wherein the first cooling circuit is provided for cooling the energy store during operation, and the second cooling circuit is provided for heating purposes.

DE 10 2015 106 336 A1, which is incorporated by reference herein, presents a main circuit for the exchange of heat with a drive apparatus and a secondary circuit for the exchange of heat with a battery, wherein a connecting heat exchanger is provided between the two circuits.

EP 2 176 920 B1, which is incorporated by reference herein, presents a motor vehicle having an internal combustion engine and a battery, wherein thermal energy from the exhaust gas of the internal combustion engine is supplied to a medium for heating the battery.

U.S. Pat. No. 5,730,237 A, which is incorporated by reference herein, presents a vehicle having a heater which generates heat by combustion. Said heater is also used for heating a battery.

SUMMARY OF THE INVENTION

It is therefore an object of the invention to provide a novel temperature-control arrangement.

Said object is achieved by a temperature-control arrangement having an electrical energy store, a thermal device, a cooling device and a coolant circuit with coolant lines, which coolant lines are at least partially activatable and deactivatable by means of controllable valves, which temperature-control arrangement is designed to permit at least a first state and a second state of the coolant circuit through actuation of the controllable valves, wherein the coolant circuit is designed to, in the first state, permit a coolant flow from the cooling device both to the thermal device and to the electrical energy store, and from these back to the cooling device, in order to cool the thermal device and the electrical energy store, and wherein the coolant circuit is designed to, in the second state, permit a coolant flow from the thermal device to the electrical energy store, and from the latter back to the thermal device, in order to heat the electrical energy store.

Through the provision of the two states Z1 and Z2, heating and cooling of the electrical energy store is achieved in an advantageous manner from an energy aspect.

In an embodiment, in the first state Z1, the coolant line has a branching point which is provided between the cooling device and the electrical energy store, which branching point is designed to conduct the coolant proceeding from the cooling device to the thermal device and to the electrical energy store in parallel. In this way, the thermal device and the electrical energy store are cooled with coolant that is as cool as possible.

In an embodiment, the temperature-control arrangement is designed to, in the second state Z2, deactivate a coolant line to the cooling device in order to prevent cooling, at the cooling device, of the coolant circulating in the coolant circuit. With this measure, the heating of the electrical energy store can be performed more quickly than when the cooling device in the coolant circuit is active.

In an embodiment, the temperature-control arrangement is designed to, in the first state Z1, conduct the coolant via a predefined coolant line in a predefined direction to the thermal device and away from the latter, and, in the second state, reverse the direction of the coolant flow through said predefined coolant line. This measure has permitted an interconnection of the coolant lines in the case of which fewer coolant lines or fewer valves are required than without this measure.

In an embodiment, the thermal device and the electrical energy store are connected fluidically in parallel in the first state and are connected in series in the second state. In this way, both the cooling and the heating of the electrical energy store can be improved.

In an embodiment, the temperature-control arrangement has a pump apparatus with an inlet and an outlet for effecting a coolant flow through the coolant circuit. In coolant circuits in which the coolant flow does not occur of its own accord or occurs only weakly, the coolant flow and thus the cooling and heating can be considerably improved.

In an embodiment, the temperature-control arrangement has a first coolant line between the outlet of the pump apparatus and the cooling device and a second coolant line between the thermal device and the inlet of the pump apparatus, wherein a first controllable valve is provided on the first coolant line and a second controllable valve is provided on the second coolant line, which first controllable valve is connected by means of a third coolant line to the second controllable valve. This fluidic interconnection permits utilization of the pump apparatus for both states Z1 and Z2, and a second pump apparatus can be omitted.

In an embodiment, the temperature-control arrangement is designed to, in the first state Z1, permit a coolant flow from the pump via the first coolant line to the cooling device and from the cooling device via the thermal device and via the second line to the inlet of the pump apparatus, and, in the second state Z2, permit a coolant flow from the pump via the first coolant line to the first valve, and from there via the third coolant line to the second valve, and from the second valve via the second coolant line to the thermal device. This interconnection eliminates the need for further lines to the electrical energy store, to the thermal device and to the cooling device.

In an embodiment, the electrical energy store is formed as a battery apparatus. In the case of battery apparatuses, the operating temperature is particularly critical.

In an embodiment, the temperature-control arrangement has a temperature measuring apparatus for generating a temperature value T. Such a temperature measuring apparatus permits a good estimation of which state Z1 or Z2 is the more advantageous.

In an embodiment, the temperature-control arrangement is designed to perform the transition from the first state Z1 to the second state Z2 in a manner dependent on the generated temperature value T.

In an embodiment, the temperature-control arrangement is designed to check the temperature value T at predefined time intervals and to perform a transition to the first state Z1 in the event of an undershooting of a predefined temperature threshold value T_min. The electrical energy store is protected in this way.

In an embodiment, the thermal device comprises a motor, which motor is activatable and deactivatable by a user, and in the case of which the transition to the first state Z1 in the event of an undershooting of a predefined temperature minimum value, and an activation of the motor, are performed even if the user has deactivated the motor. In this way, it is for example possible for a passenger motor vehicle in the case of which the driver has deactivated the ignition lock to nevertheless be protected against destruction of the electrical energy store.

BRIEF DESCRIPTION OF THE DRAWINGS

Further details and advantageous refinements of the invention will emerge from the exemplary embodiments described below and illustrated in the drawing, which embodiments should in no way be understood as restricting the invention, and also from the dependent claims. In the figures:

DETAILED DESCRIPTION OF THE INVENTION

Figure 1:
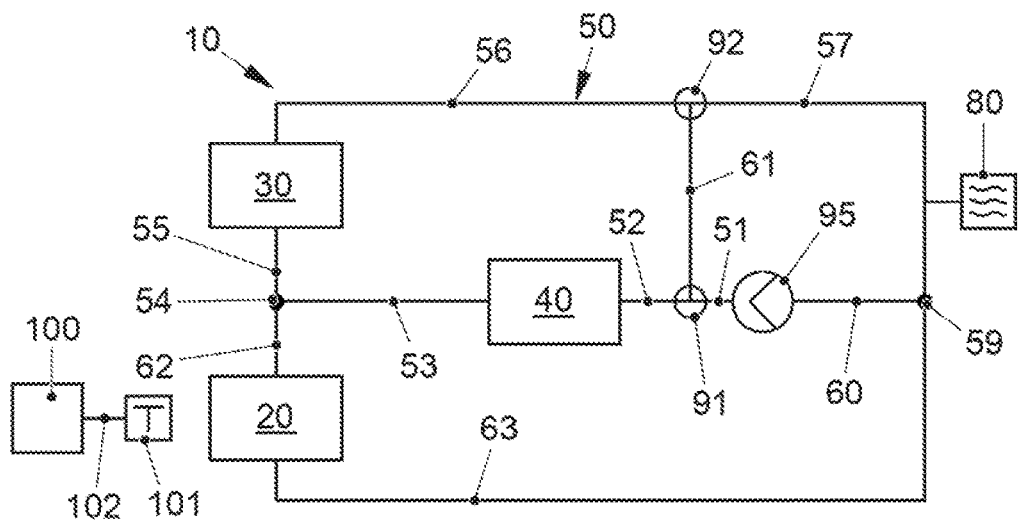
FIG. 1 is a schematic illustration of a temperature-control arrangement with an electrical energy store.

FIG. 1 shows a temperature-control arrangement 10 with an electrical energy store 20, a thermal device 30, a cooling device 40 and a coolant circuit 50. A pump apparatus 95 with an inlet and an outlet is provided for effecting a coolant flow through the coolant circuit 50. The pump apparatus 95 is connected via a coolant line 51 to a valve 91, and the valve 91 is connected via a coolant line 52 to the cooling device 40. The cooling device 40 is connected via a coolant line 53 to a branching point 54, and the branching point 54 is connected via a coolant line 55 to the thermal device 30. The thermal device 30 is connected via a coolant line 56 to a valve 92, and the valve 92 is connected via a coolant line 57 to a distributor 59, which can also be referred to as a branching point 59. The distributor 59 is connected via a coolant line 60 to the pump apparatus 95. The valve 91 and the valve 92 are connected via a coolant line 61. The branching point 54 is connected via a coolant line 62 to the electrical energy store 20, and the electrical energy store 20 is connected via a coolant line 63 to the distributor 59. On the electrical energy store 20 there is provided a temperature measuring apparatus 101 which can generate a temperature value T which characterizes the temperature in the electrical energy store 20. The temperature value T may be transmitted via a control line 102, or else wirelessly, to a control apparatus 100, which is designed to control the valves 91, 92.

The electrical energy store 20 is preferably a traction battery for an electric drive, although it may also be a high-performance capacitor.

The thermal device 30 may for example comprise one or more of the following devices:
an internal combustion engine,
a brake system,
an electric motor,
a transmission,
a set of power electronics,
a fuel cell stack,
a generator,
an exhaust system,
a charge-air tract.

it is also possible for multiple thermal devices 30 to be provided, which are for example interconnected in parallel and/or in series.

The cooling device 40, which may physically also be referred to as a heat sink, may for example comprise one or more of the following devices:
heat exchanger with active or passive incident air flow,
heat exchanger with connection to a further cooling circuit,
thermosiphon,
contact surface of the cooling line with respect to the vehicle body.

Here, too, multiple cooling devices 40 may be connected in series and/or in parallel. Cooling devices 40 such as for example the thermosiphon have the advantage that they themselves effect a coolant flow, and do not imperatively require a pump apparatus 95 for generating the coolant flow.

As coolant 80, use is preferably made of a fluid, that is to say a liquid or a gas. A liquid coolant 80 can store more thermal energy than a gaseous coolant 80.

The coolant lines may for example be formed as a pipe, as a hose or—in particular in the region of the thermal device 30, of the electrical energy store 20 and of the cooling device 40—as a duct or bore.

Where it is stated below that the coolant is conducted via the coolant lines to the thermal device 30, to the electrical energy store 20 or to the cooling device 40, or that the coolant is conducted through said components 20, 30, 40, this comprises all possibilities which permit an exchange of heat between said components 20, 30, 40 and the coolant. The lines may for example be led through the components 20, 30, 40, or may be led past in close proximity.

With the temperature-control arrangement 10, it is possible to permit a first state Z1 and a second state Z2 of the coolant circuit 50 through corresponding actuation of the controllable valves 91, 92.

The controllable valves 91, 92 may also be referred to as controllable directional valves, and permit activation or deactivation of the coolant lines connected thereto. For example, by means of the valve 91, a coolant flow from the coolant line 51 to the coolant line 52 can be permitted, whereas a coolant flow via the coolant line 61 can be deactivated. It is however also possible for a coolant flow via the coolant lines 51 and 61 to be permitted, but for a coolant flow via the coolant line 52 to be deactivated. Here, it should be noted that, for example, a deactivation of the coolant line 61 is possible both by means of the valve 91 and by means of the valve 92 because, for the deactivation, it is sufficient for the coolant flow to be prevented at any arbitrary point of the corresponding line. The states Z1, Z2 will be described below.

Valves may also be used instead of the distributors 59.

Figure 2:
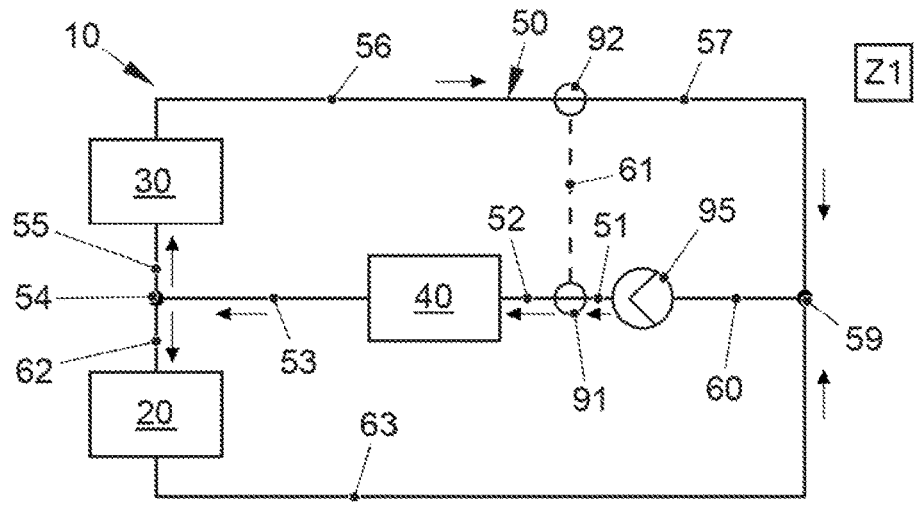
FIG. 2 is a schematic illustration of the temperature-control arrangement from FIG. 1 in a first state Z1 for the cooling of the electrical energy store.

FIG. 2 shows the first state Z1, which serves for cooling both the electrical energy store 20 and the thermal device 30. For this purpose, the coolant can flow via the coolant line 52 to the cooling device 40 and can release heat there to the cooling device 40. From the cooling device 40, the coolant is conducted via the coolant line 53 to the distributor 54 and is divided into a coolant partial flow to the thermal device 30 and a coolant partial flow to the electrical coolant store 20. From the thermal device 30, the coolant passes via the coolant lines 56, 57 and 60 to the pump apparatus 95 and from there to the cooling device 40 again, and from the electrical energy store 20, the coolant passes via the coolant lines 63 and 60 to the pump apparatus 95. As a result, the coolant is cooled by the cooling device 40, and it is subsequently conducted to the thermal device 30 and to the electrical energy store 20, wherein these are connected fluidically in parallel. The parallel connection has the advantage that the coolant passes directly from the cooling device 40 for cooling purposes, and has not already been warmed up by the thermal device 30 or the electrical energy store 20 before being conducted onward to the component arranged downstream thereof.

The coolant flow is indicated by arrows.

The coolant circuit 50 is thus designed to, in the first state Z1, permit a coolant flow from the cooling device 40 both to the thermal device 30 and to the electrical energy store 20, and from these back to the cooling device, in order to cool the thermal device 30 and the electrical energy store 20.

Figure 3:
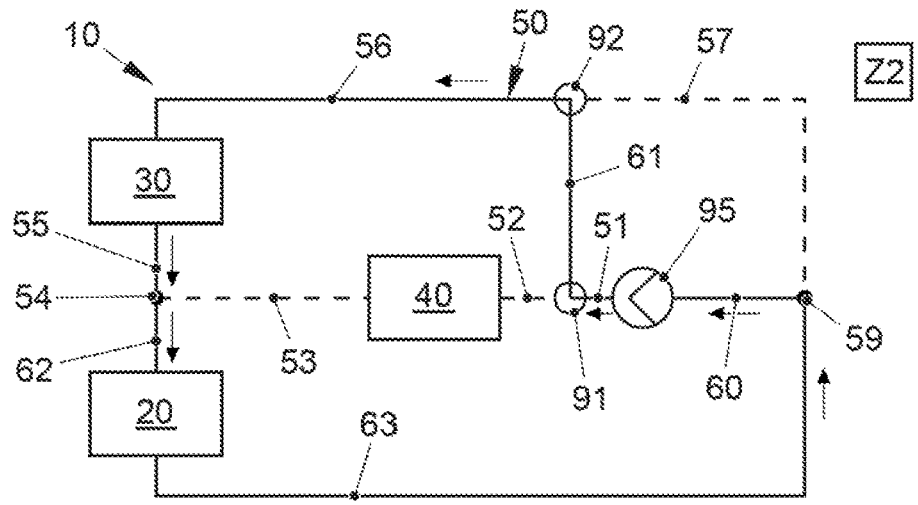
FIG. 3 is a schematic illustration of the temperature-control arrangement from FIG. 1 in a second state Z2 for the heating of the electrical energy store.

FIG. 3 shows the coolant circuit 50 in the second state Z2. In this state, it is the intention for the electrical energy store to be heated, such as is the case for example in the presence of low ambient temperatures and when the electric motor provided for operation by means of the electrical energy store 20 is at a standstill.

The coolant is conducted via the coolant lines 51, 61 and 56 to the thermal device 30 and can absorb heat there. From the thermal device 30, the coolant is conducted via the coolant lines 55, 62 to the electrical energy store 20 in order to heat the latter. Subsequently, the coolant is conducted via the coolant lines 63 and 60 to the pump apparatus 95. By means of the valves 91, 92, it is thus the case that the coolant line 61 has been activated, and preferably, the cooling device 40 has been deactivated in order to prevent cooling of the coolant at the cooling device 40. By means of this fluidic interconnection, the thermal device 30 is utilized as a heat source in an effective manner.

In the present exemplary embodiment, the coolant flow through the thermal device 30 is reversed upon a change from the first state Z1 to the second state Z2, and this has proven to be highly advantageous for the reduction of the coolant lines. Furthermore, the valves 91, 92 can be arranged in close proximity to the pump apparatus 95, such that the overall length of the coolant lines can be kept short.

Thus, the coolant circuit 50 is designed to, in the second state Z2, permit a coolant flow from the thermal device 30 to the electrical energy store 20, and from the latter back to the thermal device 30, in order to heat the electrical energy store 20.

Figure 4:
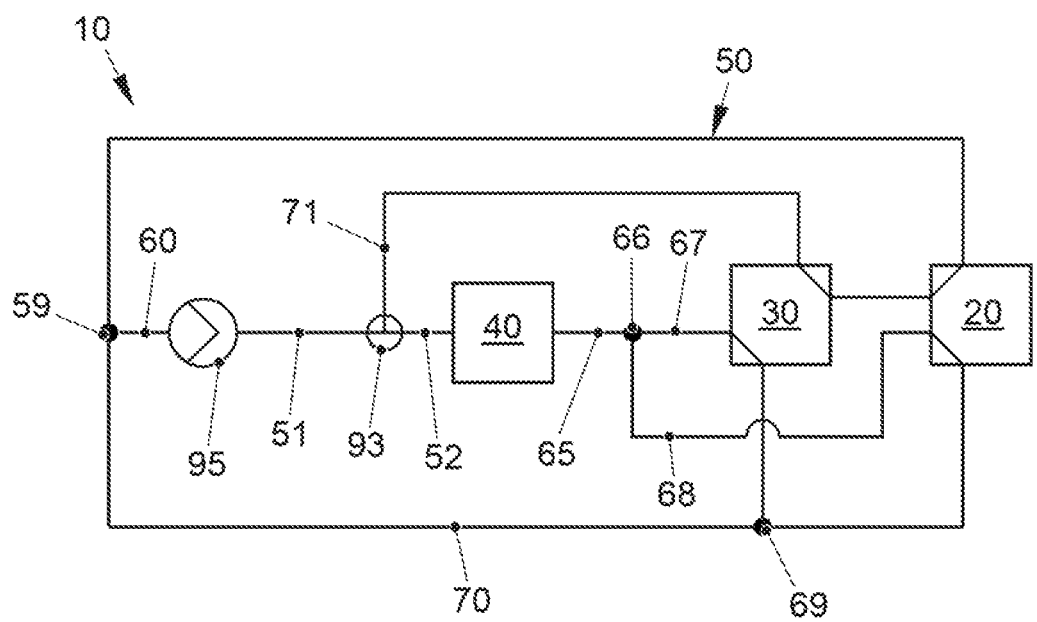
FIG. 4 is a schematic illustration of a further embodiment of a temperature-control arrangement with an electrical energy store.

FIG. 4 shows a further exemplary embodiment for the coolant circuit 50, in which the pump 95 is connected via the coolant line 51 to a valve 93. The valve 93 is connected via a coolant line 52 to the cooling device 40, and the cooling device 40 is connected via a coolant line 65 to a distributor 66. The distributor 66 is connected via a coolant line 67 to a distributor 69, wherein the coolant line 67 is thermally connected to the thermal device 30, that is to say an exchange of heat is possible between the thermal device 30 and the coolant in the coolant line 67. The distributor 66 is connected via a coolant line 68 to the distributor 69, wherein the coolant line 68 is in thermal contact with the electrical energy store 20. The distributor 69 is connected via a coolant line 70 to the distributor 59. The valve 93 is connected via a coolant line 71 to the distributor 59, wherein the coolant line 71 is in thermal contact both with the thermal device 30 and with the electrical energy store 20.

The first state Z1 can be set by virtue of the valve 93 connecting the coolant lines 51 and 52 but deactivating the coolant line 71. The coolant that is cooled by the cooling device 40 subsequently flows through the thermal device 30 and, in parallel therewith, through the electrical energy store 20 and subsequently back to the pump 95.

To produce the second state Z2, the valve 93 is switched such that the coolant lines 51 and 71 are connected, whereas the coolant line 52 is deactivated. As a result, the coolant flows from the pump 95 via the thermal device 30 and subsequently via the electrical energy store 20 back to the pump apparatus 95.

Fewer valves but a greater number of coolant lines are required in relation to the solution of FIG. 1.

Figure 5:
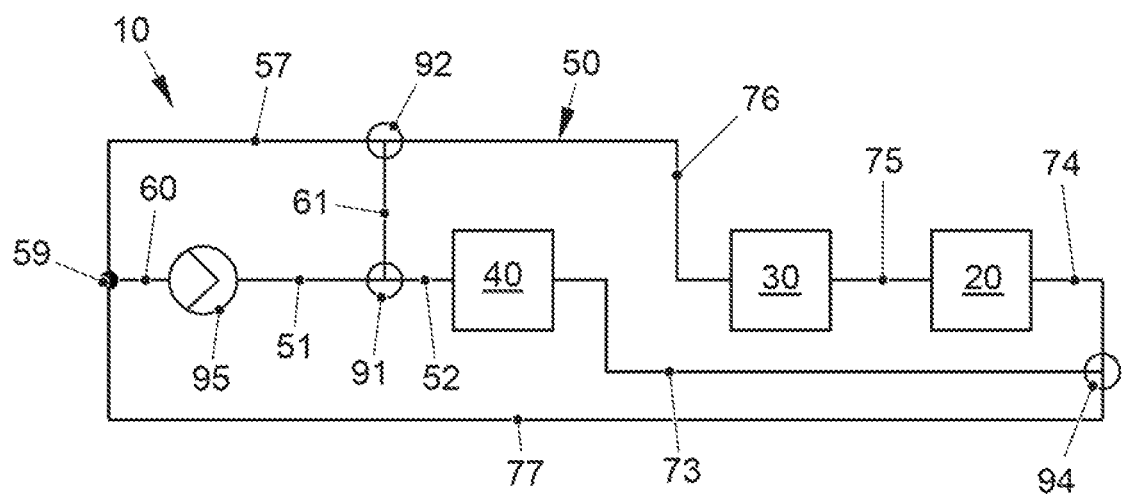
FIG. 5 is a schematic illustration of a further embodiment of a temperature-control arrangement with an electrical energy store.

FIG. 5 shows a further embodiment of the temperature-control arrangement 10. The pump apparatus 95 is connected via the coolant line 51 to the valve 91. The valve 91 is connected via the coolant line 52 to the cooling device 40, and the cooling device 40 is connected via the coolant line 73 to the valve 94. The valve 94 is connected via a coolant line 77 to the distributor 59, and the distributor 59 is connected via the coolant line 60 to the pump apparatus 95. The valve 94 is connected via the coolant line 74 to the electrical energy store 20, and the electrical energy store 20 is connected via the coolant line 75 to the thermal device 30. The thermal device 30 is connected via a coolant line 76 to the valve 92, and the valve 92 is connected both via a coolant line 57 to the distributor 59 and via a coolant line 61 to the valve 91. The embodiment in the region of the pump apparatus 95 corresponds to the embodiment of FIG. 1. By contrast to FIG. 1, however, the electrical energy store 20 and the thermal device 30 are connected fluidically in series.

To achieve the first state Z1, the coolant lines 51 and 52 are connected to one another by means of the valve 91, and the coolant line 61 is deactivated. By means of the valve 94, the coolant lines 73 and 74 are connected to one another, and the coolant line 77 is deactivated. By means of the valve 92, the coolant lines 76 and 57 are connected to one another. In this way, the coolant can be conducted from the pump apparatus 95 via the cooling device 40, the electrical energy store 20 and the thermal device 30 back to the pump apparatus 95, and cooling of the electrical energy store 20 and of the thermal device 30 is realized.

To achieve the second state Z2, the valve 91 is switched such that the coolant lines 51 and 61 are connected to one another, whereas the coolant line 52 is deactivated. By means of the valve 92, the coolant lines 61 and 76 are connected to one another, and the coolant line 57 is deactivated. By means of the valve 94, the coolant lines 74 and 77 are connected to one another, and the coolant line 73 is deactivated. As a result, the coolant can be conducted from the pump apparatus 95 via the thermal device 30 and subsequently via the electrical energy store 20 back to the pump apparatus 95.

Switching Between the States Z1 and Z2

During operation, the measurement value T is determined by means of the temperature measuring apparatus 101 of FIG. 1 and is evaluated. If the temperature measurement value T subsequently increases beyond a predefined temperature threshold, a switch can be performed from the first state Z1 into the second state Z2, preferably by means of the control apparatus 100 of FIG. 1.

In an embodiment, a temperature minimum value T_min_critical is predefined, which characterizes a temperature in the presence of which damage to the electrical energy store 20 can occur. It is preferably the case that, in the event of such a temperature minimum value being reached, the first state Z1 is activated even if a user has deactivated a motor provided for operation by means of the electrical energy store 20, that is to say for example if a vehicle with a corresponding temperature-control arrangement 10 is shut down. Damage to the electrical energy store 20 is hereby prevented. If heat can be generated by means of the thermal device 30 as a result of activation of said thermal device 30, the thermal device 30 is preferably likewise set in operation. This may for example be advantageous if an engine-independent heater is provided and available as a thermal device 30.

Multiple variations and modifications are of course possible within the scope of the present invention.

What is claimed is:

1. A temperature-control arrangement comprising:
   controllable valves,
   an electrical energy store,
   a thermal device,
   a cooling device, and
   a coolant circuit with coolant lines, the coolant lines at least partially activatable and deactivatable by the controllable valves,
   wherein the temperature-control arrangement is configured to permit at least a first state and a second state of the coolant circuit through actuation of the controllable valves,
   wherein the coolant circuit is configured to, in the first state, permit coolant flow between the cooling device and both the thermal device and the electrical energy store in order to cool the thermal device and the electrical energy store, and
   wherein the coolant circuit is configured to, in the second state, permit coolant flow between the thermal device and the electrical energy store in order to heat the electrical energy store,
   wherein the thermal device and the electrical energy store are connected fluidically in parallel in the first state and are connected fluidically in series in the second state.

2. The temperature-control arrangement as claimed in claim 1, in which, in the first state, the coolant line has a branching point which is provided between the cooling device and the electrical energy store, the branching point configured to conduct the coolant proceeding from the cooling device to the thermal device and to the electrical energy store in parallel.

3. The temperature-control arrangement as claimed in claim 1, which is configured to, in the second state, deactivate a coolant line to the cooling device in order to prevent cooling, at the cooling device, of the coolant circulating in the coolant circuit.

4. The temperature-control arrangement as claimed in claim 1, which is configured to, in the first state, conduct the coolant via a predefined coolant line in a predefined direction to the thermal device, and, in the second state, reverse the direction of the coolant flow through said predefined coolant line.

5. The temperature-control arrangement as claimed in claim 1, in which the thermal device comprises at least one of the following devices:
   an internal combustion engine,
   a brake system,
   an electric motor,
   a transmission,
   a set of power electronics,
   a fuel cell stack,
   a generator,
   an exhaust system, or
   a charge-air tract.

6. The temperature-control arrangement as claimed in claim 1, in which the cooling device comprises at least one of the following devices:
   heat exchanger with active or passive incident air flow,
   heat exchanger with connection to a further cooling circuit,
   thermosiphon, or
   contact surface of the cooling line with respect to the vehicle body.

7. The temperature-control arrangement as claimed claim 1, further comprising:
   a pump apparatus with an inlet and an outlet for effecting a coolant flow through the coolant circuit.

8. A temperature-control arrangement comprising:
   controllable valves,
   an electrical energy store,
   a thermal device,
   a cooling device, and
   a coolant circuit with coolant lines, the coolant lines at least partially activatable and deactivatable by the controllable valves,
   a pump apparatus with an inlet and an outlet for effecting a coolant flow through the coolant circuit,
   wherein the temperature-control arrangement is configured to permit at least a first state and a second state of the coolant circuit through actuation of the controllable valves, wherein the coolant circuit is configured to, in the first state, permit coolant flow between the cooling device and both the thermal device and the electrical energy store in order to cool the thermal device and the electrical energy store, and wherein the coolant circuit is configured to, in the second state, permit coolant flow between the thermal device and the electrical energy store in order to heat the electrical energy store, wherein a first of the coolant lines is between the outlet of the pump apparatus and the cooling device and which has a second of the coolant lines is between the thermal device and the inlet of the pump apparatus, a first of the controllable valves is provided on the first coolant line and a second of the controllable valves is provided on the second coolant line, and the first controllable valve is connected by a third coolant line to the second controllable valve.

9. The temperature-control arrangement as claimed in claim 8, which is designed to, in the first state, permit a coolant flow from the pump via the first coolant line to the cooling device and from the cooling device via the thermal device and via the second line to the inlet of the pump apparatus, and, in the second state, permit a coolant flow from the pump via the first coolant line to the first valve, and from there via the third coolant line to the second valve, and from the second valve via the second coolant line to the thermal device.

10. The temperature-control arrangement as claimed in claim 1, in which the electrical energy store is formed as a battery apparatus.

11. The temperature-control arrangement as claimed in claim 1, further comprising:
   a temperature measuring apparatus for generating a temperature value, and
   a control apparatus that is configured to reconfigure the arrangement between the first and second states as a function of the generated temperature value.

12. The temperature-control arrangement as claimed in claim 11, which is configured to perform the transition from the first state to the second state dependent on the generated temperature value.

13. The temperature-control arrangement as claimed in claim 11, which is configured to check the temperature value at predefined time intervals and to perform a transition to the first state in the event of an undershooting of a predefined temperature threshold value.

14. The temperature-control arrangement as claimed in claim 13, wherein the thermal device comprises a motor, the motor is activatable and deactivatable by a user, and in the event of an undershooting of a predefined temperature minimum value the temperature-control arrangement transition to the first state and an activation of the motor are performed even if the user has deactivated the motor.

* * * * *